United States Patent
Matsukawa et al.

(12)

(10) Patent No.: US 11,302,593 B2
(45) Date of Patent: Apr. 12, 2022

(54) ELECTRONIC COMPONENT PACKAGE AND METHOD FOR MANUFACTURING THE SAME

(71) Applicant: Murata Manufacturing Co., Ltd., Kyoto (JP)

(72) Inventors: Yoshitaka Matsukawa, Kyoto (JP); Yoichi Takagi, Kyoto (JP); Akio Katsube, Kyoto (JP); Yoshitaka Echikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/928,090

(22) Filed: Jul. 14, 2020

(65) Prior Publication Data
US 2020/0343152 A1    Oct. 29, 2020

Related U.S. Application Data

(63) Continuation of application No. PCT/JP2019/000483, filed on Jan. 10, 2019.

(30) Foreign Application Priority Data

Jan. 15, 2018   (JP) .............................. JP2018-004157

(51) Int. Cl.
*H01L 23/28*      (2006.01)
*H01L 23/495*     (2006.01)
(Continued)

(52) U.S. Cl.
CPC ........ *H01L 23/28* (2013.01); *H01L 23/49541* (2013.01); *H01L 23/49582* (2013.01);
(Continued)

(58) Field of Classification Search
CPC .. H05K 2203/1316; H01L 2224/32245; H01L 23/49541; H01L 23/49575;
(Continued)

(56) References Cited

U.S. PATENT DOCUMENTS 5,838,551 A * 11/1998 Chan .................... H01L 23/552
                                                        361/818
2015/0173258 A1 * 6/2015 Chen .................... H05K 9/0037
                                                        361/753
(Continued)

FOREIGN PATENT DOCUMENTS

JP   2012028484 A   2/2012
JP   2017022167 A   1/2017
(Continued)

OTHER PUBLICATIONS

International Search Report issued in Application No. PCT/JP2019/000483, dated Mar. 19, 2019.
Written Opinion issued in Application No. PCT/JP2019/000483, dated Mar. 19, 2019.

*Primary Examiner* — Jasmine J Clark
(74) *Attorney, Agent, or Firm* — Pearne & Gordon LLP

(57) ABSTRACT

An electronic component package (100) includes a resin layer (40), an electronic component (10), a grounding member (30), and a conductor film (50). The grounding member (30) includes a multilayer body (31) and an outer conductor (32) disposed at an end portion of the multilayer body (31) in a lamination direction. The multilayer body (31) includes at least one resin film (31a) and at least one pattern conductor (31b) laminated one on another, and at least one via conductor (31c) extending in the lamination direction and connected to the outer conductor (32). In the multilayer body (31), at least one of the pattern conductor (31b) has at least part of a circumference connected to a conductor film (50) and electrically connected to the via conductor (31c). Part of an external terminal and part of the outer conductor (32) are exposed from an identical surface of the resin layer (40).

4 Claims, 11 Drawing Sheets

(51) Int. Cl.
*H01L 23/00* (2006.01)
*H05K 3/28* (2006.01)
*H05K 9/00* (2006.01)

(52) U.S. Cl.
CPC .............. *H01L 24/16* (2013.01); *H01L 24/32* (2013.01); *H05K 3/284* (2013.01); *H05K 9/0064* (2013.01); *H01L 2224/16225* (2013.01); *H01L 2224/32245* (2013.01); *H01L 2924/181* (2013.01)

(58) Field of Classification Search
CPC ....... H01L 23/3107; H01L 2224/16225; H01L 2924/181; H01L 21/561; H01L 25/16; H01L 23/48
See application file for complete search history.

(56) References Cited

U.S. PATENT DOCUMENTS

| | | |
|---|---|---|
| 2017/0092633 A1* | 3/2017 | Tomonari .............. H01L 21/561 |
| 2017/0311448 A1 | 10/2017 | Kawabata |
| 2017/0330838 A1 | 11/2017 | Mizutani et al. |
| 2018/0197822 A1 | 7/2018 | Sawamoto et al. |

FOREIGN PATENT DOCUMENTS

| | | | |
|---|---|---|---|
| JP | 2017199896 A | 11/2017 | |
| WO | 2016092633 A1 | 6/2016 | |

\* cited by examiner

ELECTRONIC COMPONENT PACKAGE AND METHOD FOR MANUFACTURING THE SAME

This is a continuation of International Application No. PCT/JP2019/000483 filed on Jan. 10, 2019 which claims priority from Japanese Patent Application No. 2018-004157 filed on Jan. 15, 2018. The contents of these applications are incorporated herein by reference in their entireties.

BACKGROUND OF THE DISCLOSURE

Field of the Disclosure

The present disclosure relates to an electronic component package and a method for manufacturing the same.

Background Art

Examples of an electronic component package that includes an electronic component, a resin layer, and a conductor film without including a support board include an electronic component package described in International Publication No. 2016/092633 (Patent Document 1). FIG. 14 is a cross-sectional view of an electronic component package described in Patent Document 1.

An electronic component package 200 includes an electronic component 210, a resin layer 240, a conductor film 250, a lead frame 280, and wires 290 without including a support board. The electronic component 210, the lead frame 280, and the wires 290 are embedded in the resin layer 240.

The lead frame 280 includes a first portion 281, second portions 282, and third portions 283 disposed to surround the second portions 282. The second portions 282 are internal wirings, and the third portions 283 are ground terminals. The electronic component 210 is fixed onto the first portion 281, and connected to the second portions 282 via the wires 290. The conductor film 250 is applied to the outer surface of the resin layer 240, and connected to portions of the third portions 283 exposed from the resin layer 240.

Each of FIGS. 15A, 15B and 15C is a cross-sectional view illustrating part of a process for manufacturing the electronic component package 200. As illustrated in FIG. 15A, in the process for manufacturing the electronic component package 200, first, a package aggregate is manufactured. In the package aggregate, the electronic component 210 is connected to each of the lead frames 280 and an aggregate of the lead frames 280 is embedded in a coupled resin layer 240A. In the package aggregate, the third portions 283 correspond to a coupled unit 283W containing adjacent two third portions 283.

Subsequently, as illustrated in FIG. 15B, the package aggregate is cut with, for example, a dicing saw. Here, each coupled unit 283W is cut into two third portions 283. Then, as illustrated in FIG. 15C, the conductor film 250 is applied to each cut semifinished product to complete the electronic component package 200. The conductor film 250 is connected to portions of the third portions 283 exposed from the resin layer 240.

Patent Document 1: International Publication No. 2016/092633

BRIEF SUMMARY OF THE DISCLOSURE

One of the characteristics of the above electronic component package 200 is that the electronic component package 200 is manufactured using an aggregate of the lead frames 280 each including the first portion 281, the second portions 282, and the coupled unit 283W for the third portions 283. Thus, in the manufacturing process, the coupled resin layer 240A and the coupled units 283W made of metal are concurrently cut with, for example, a dicing saw.

Normally, cutting starts from the coupled resin layer 240A. When the dicing saw blade cuts in from the coupled resin layer 240A and reaches the coupled unit 283W made of metal, the hardness of an object to be cut changes abruptly. This abrupt change may require replacement of the dicing saw blade due to acceleration of a wearing out of the dicing saw blade that is to further cut the object or distortion and breakage. This replacement of the blade may hinder smooth manufacturing.

In addition, the dicing saw blade that pushes the coupled unit 283W may separate the coupled unit 283W from the coupled resin layer 240A. This separated portion may cause a structural defect that degrades the electronic component package 200 in view of, for example, moisture resistance.

Specifically, an object of the present disclosure is to provide an electronic component package that prevents occurrence of structural defects, and a method for manufacturing the same.

An electronic component package according to a first aspect of the present disclosure includes a resin layer, an electronic component, a grounding member, and a conductor film. The electronic component is partially covered with the resin layer, and includes an external terminal. The grounding member is partially covered with the resin layer. The conductor film is disposed on a surface of the resin layer. The grounding member includes a multilayer body and an outer conductor disposed at an end portion of the multilayer body in a lamination direction. The multilayer body includes at least one resin film and at least one pattern conductor laminated one on another, and at least one via conductor extending in the lamination direction and connected to the outer conductor. The multilayer body includes a first surface, a second surface disposed opposite to the first surface in the lamination direction, and a third surface, which connects the first surface and the second surface. In the multilayer body, at least one of the pattern conductor has at least part of a circumference connected to the conductor film at the third surface, and electrically connected to a via conductor. Part of the external terminal and part of the outer conductor are exposed from an identical surface of the resin layer.

A method for manufacturing an electronic component package according to a second aspect of the present disclosure is a method for manufacturing an electronic component package including a resin layer, an electronic component, a grounding member, and a conductor film. The electronic component is partially covered with a resin layer, and includes an external terminal. The grounding member is partially covered with the resin layer. The grounding member includes a multilayer body, and an outer conductor disposed at an end portion of the multilayer body in a lamination direction. The multilayer body includes at least one resin film and at least one pattern conductor laminated one on another. A conductor film is disposed on a surface of the resin layer. The method for manufacturing an electronic component package includes a holding step, a resin-layer application step, a removal step, a cutting step and a conductor-film application step. In the holding step, a base including a base member and an adhesive layer applied to a first main surface of the base member, the electronic component, and a coupled grounding member including a coupled multilayer body obtained by coupling a plurality of the multilayer bodies are manufactured or prepared, and the external terminal of the electronic component and the outer conductor of the coupled grounding member are arranged on the adhesive layer to allow the electronic component and the coupled grounding member to be held on the base. In the resin-layer application step, the resin layer is applied to the adhesive layer to cover a surface of the electronic component excluding an area over which the external terminal is in contact with the adhesive layer and a surface of the coupled grounding member excluding an area over which the outer conductor is in contact with the adhesive layer. In the removal step, the base is removed to expose, from an identical surface of the resin layer, at least part of the external terminal of the electronic component and at least part of the outer conductor of the coupled grounding member. In the cutting step, together with the resin layer, the coupled grounding member is cut into a plurality of the grounding members and exposing part of a circumference of the pattern conductor. In the conductor-film application step, the conductor film is applied to a surface of the resin layer to connect the conductor film with the exposed part of the circumference of the pattern conductor.

The present disclosure can prevent occurrence of structural defects in an electronic component package.

Each of FIGS. 3A to 3F is a cross-sectional view of an example of a process for manufacturing the electronic component package 100.

Figure 4A:
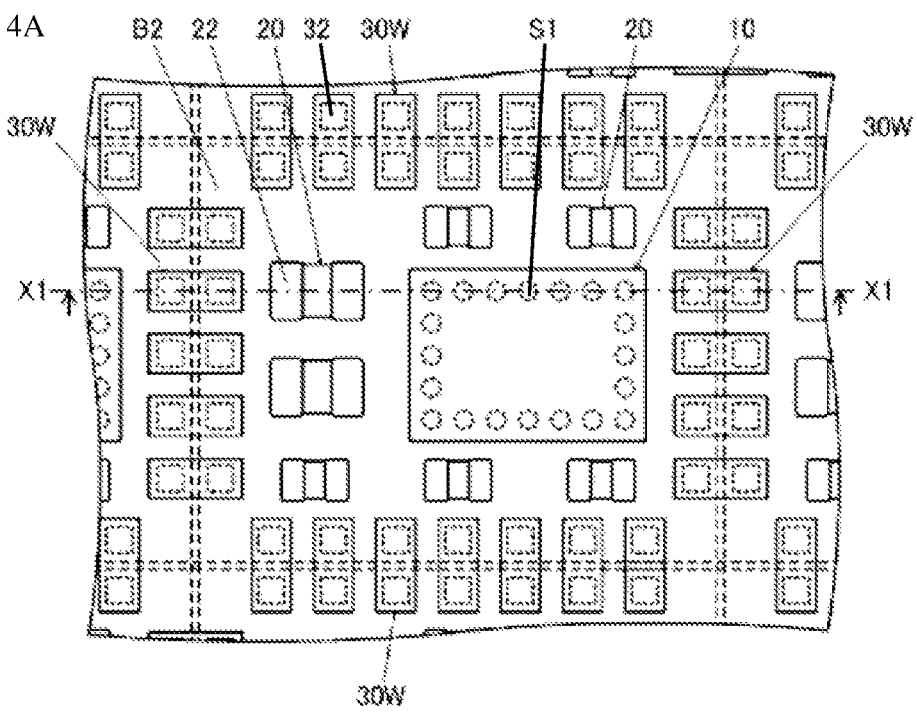
Figure 4B:
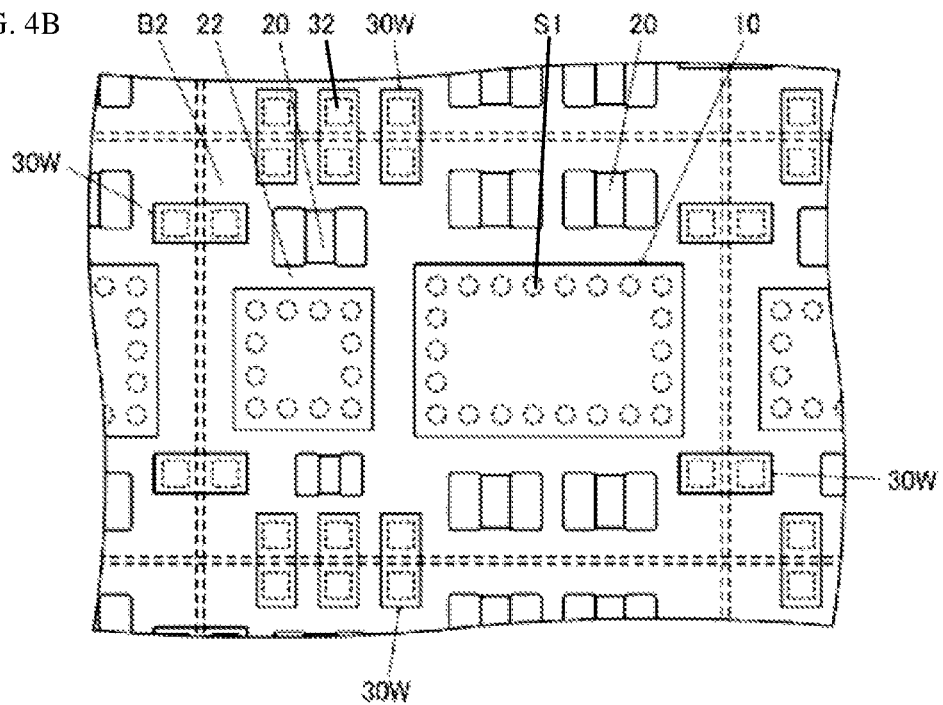

Each of FIGS. 4A and 4B is a plan view of an example of a process for manufacturing the electronic component package 100, where an electronic component 10, electronic components 20, and coupled grounding members 30W are held on a base B.

Figure 5A:
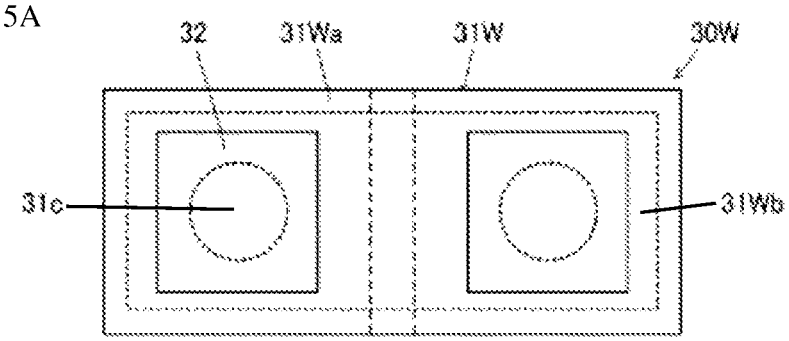
Figure 5B:
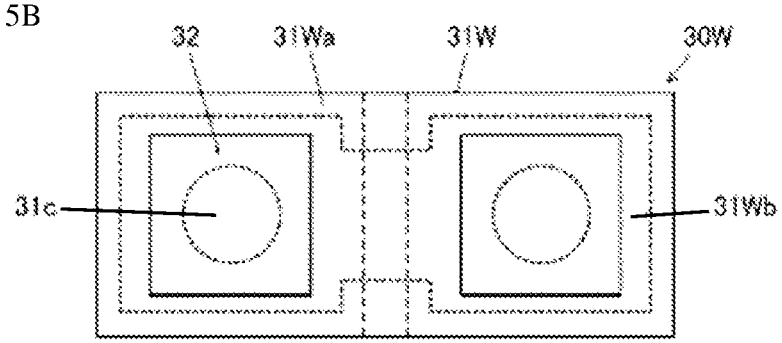
Figure 5C:
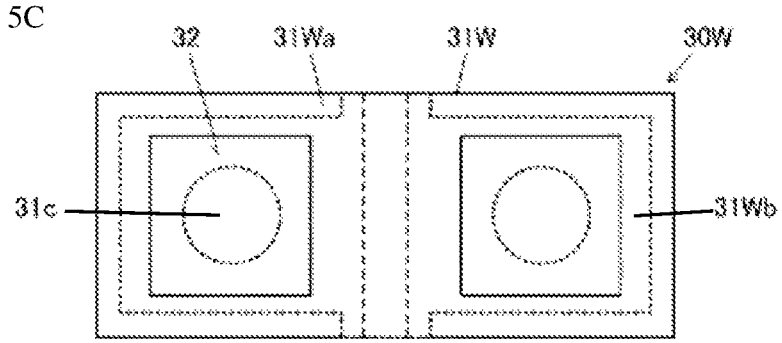

Each of FIGS. 5A, 5B and 5C is a bottom view of coupled grounding members 30W according to first to third modification examples.

Figure 6A:
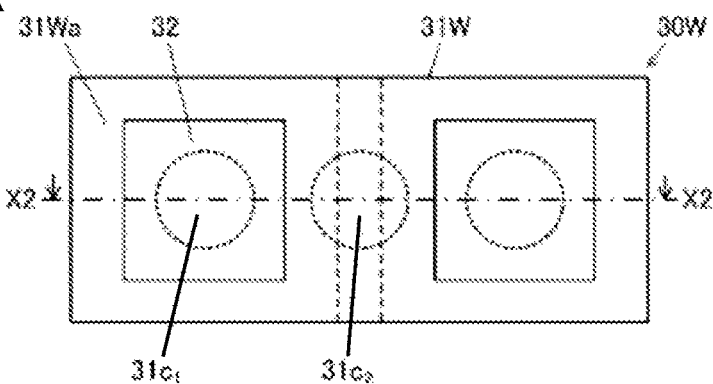
Figure 6B:
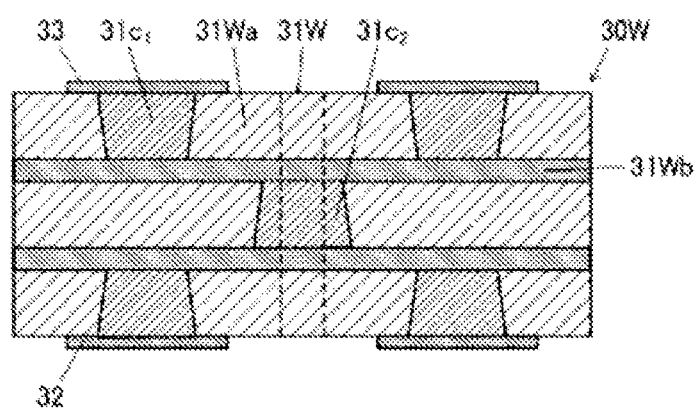
Figure 6C:
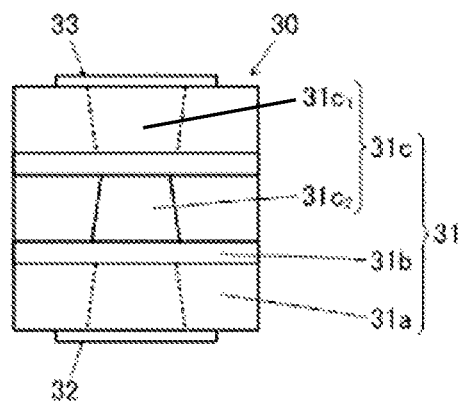

Each of FIGS. 6A, 6B and 6C includes a bottom view and a cross-sectional view of a coupled grounding member 30W according to a fourth modification example, and a front view of a grounding member 30 according to a modification example obtained by sectioning the coupled grounding member 30W according to the fourth modification example.

Figure 7A:
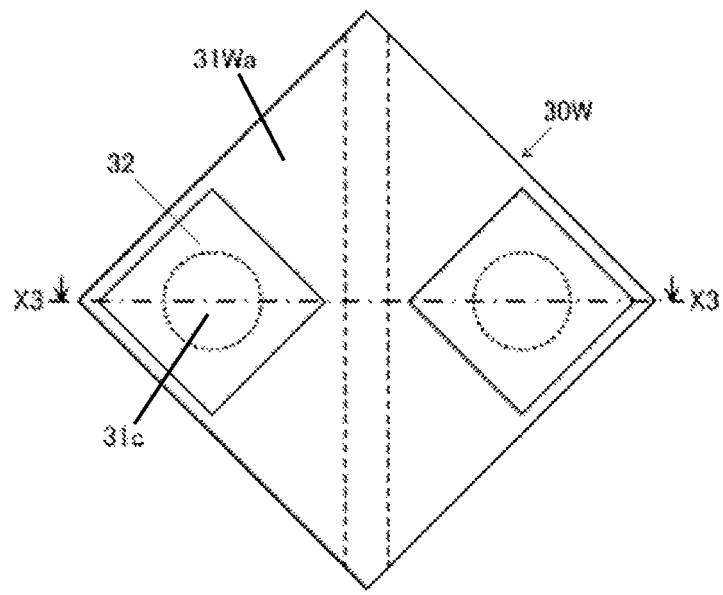
Figure 7B:
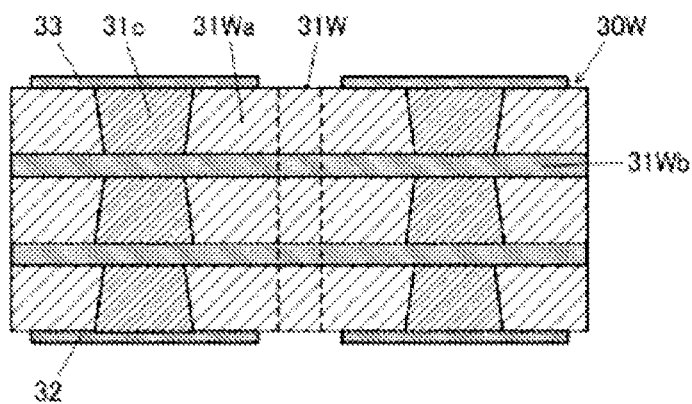
Figure 7C:
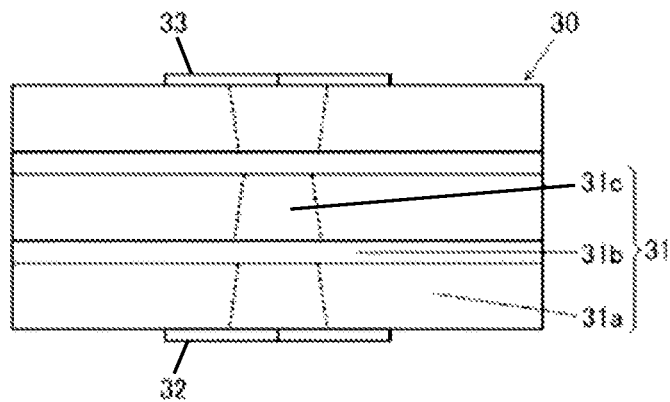

Each of FIGS. 7A, 7B and 7C includes a bottom view and a cross-sectional view of a coupled grounding member 30W according to a fifth modification example, and a front view of a grounding member 30 according to a modification example obtained by sectioning the coupled grounding member 30W according to the fifth modification example.

Figure 8:
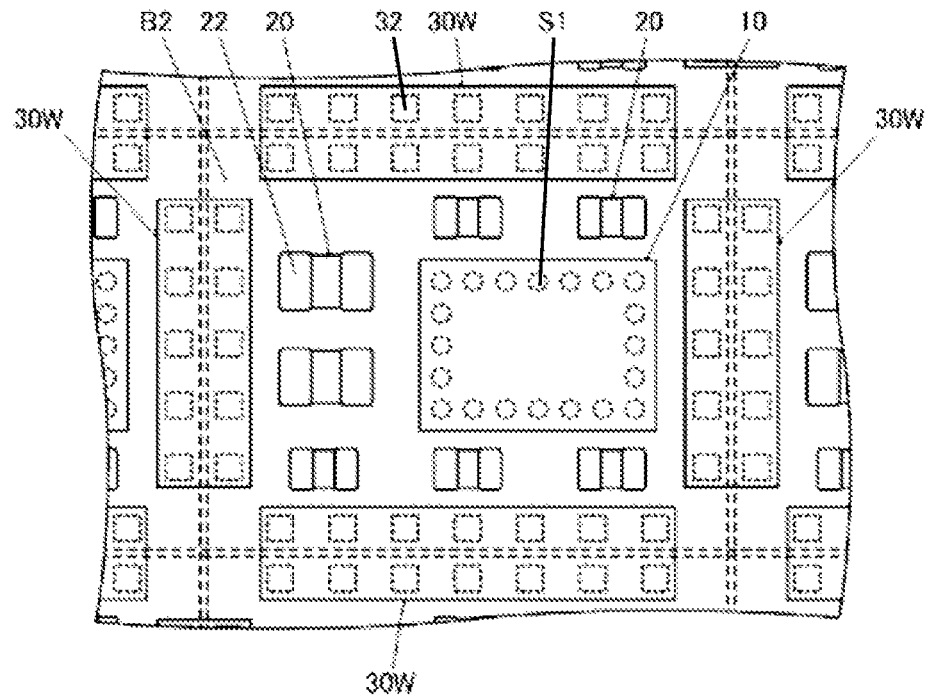

FIG. 8 is a plan view (top view) of another example of a process for manufacturing an electronic component package 100, where an electronic component 10, electronic components 20, and coupled grounding members 30W according to a sixth modification example are held on the base B.

Figure 9:
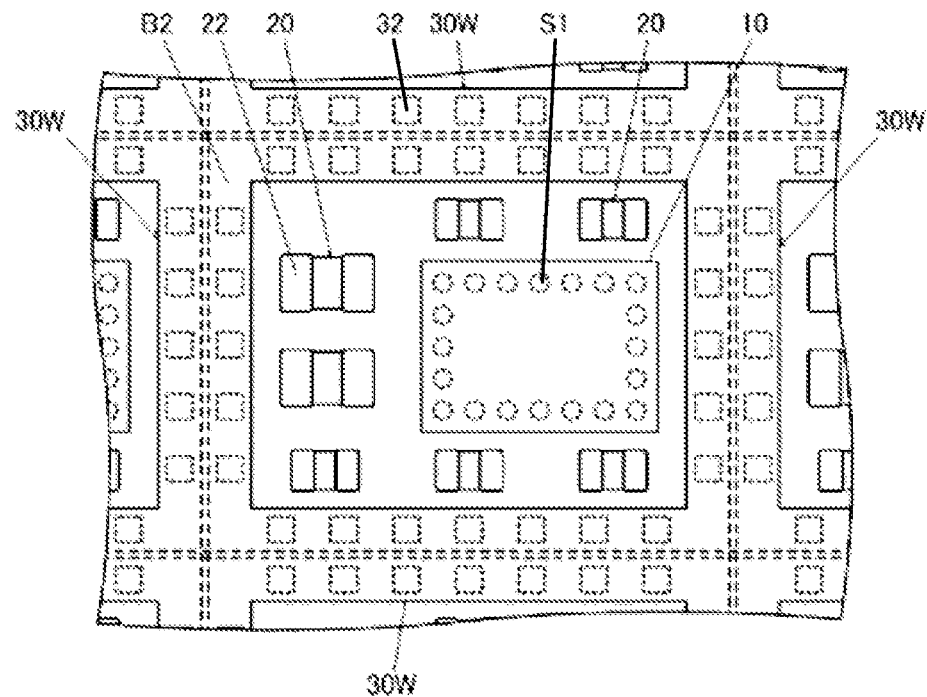

FIG. 9 is a plan view of another example of a process for manufacturing an electronic component package 100, where an electronic component 10, electronic components 20, and coupled grounding members 30W according to a seventh modification example are held on the base B.

Figure 10:
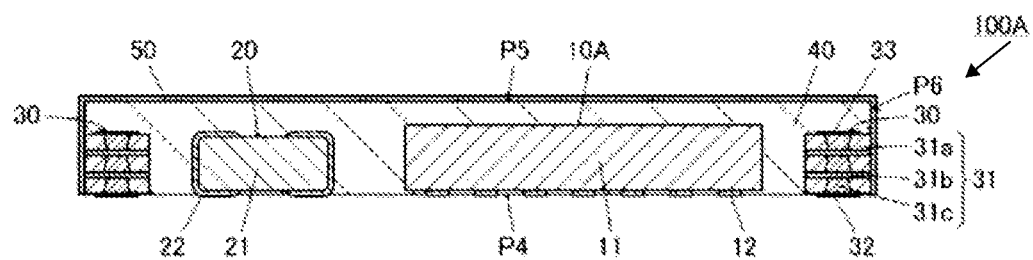

FIG. 10 is a cross-sectional view of an electronic component package 100A, which is an electronic component package according to a first modification example of the present disclosure.

Figure 11:
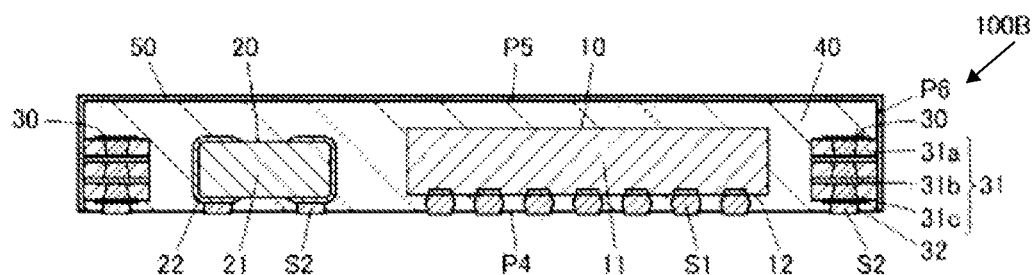

FIG. 11 is a cross-sectional view of an electronic component package 100B, which is an electronic component package according to a second modification example of the present disclosure.

Each of FIGS. 12A to 12F is a cross-sectional view illustrating an example of a process for manufacturing the electronic component package 100B, specifically, part of the process.

Figure 12A:
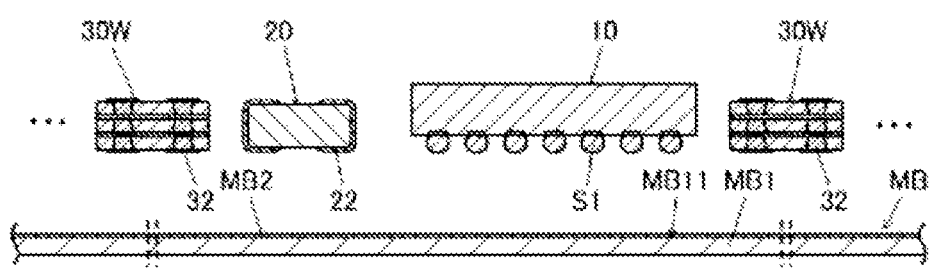
Figure 12B:
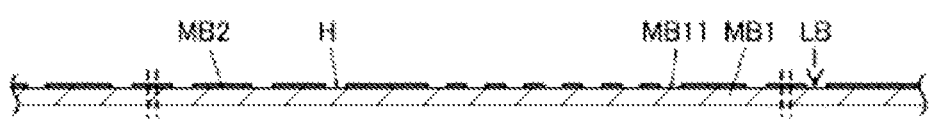
Figure 12C:
Figure 12D:
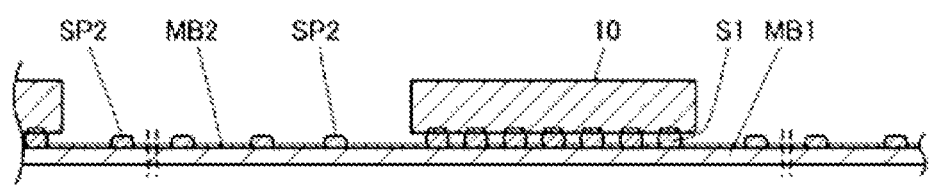
Figure 12E:
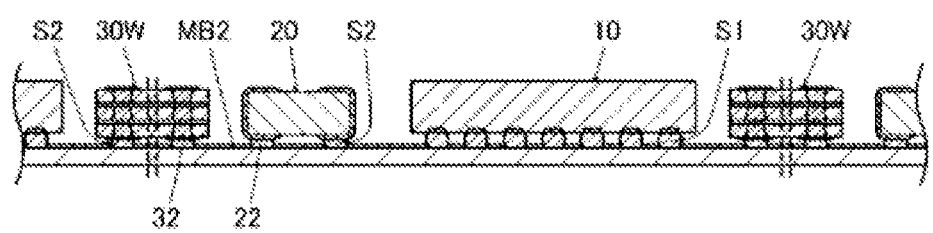
Figure 12F:
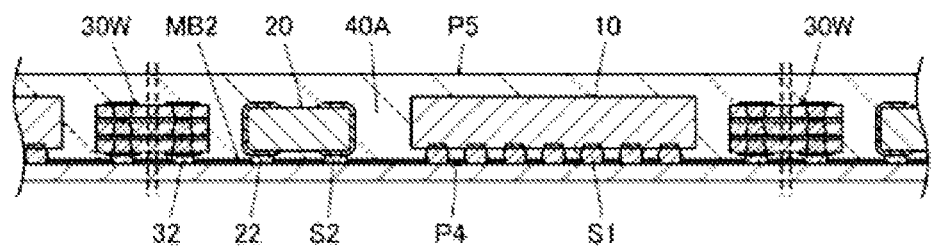
Figure 13A:
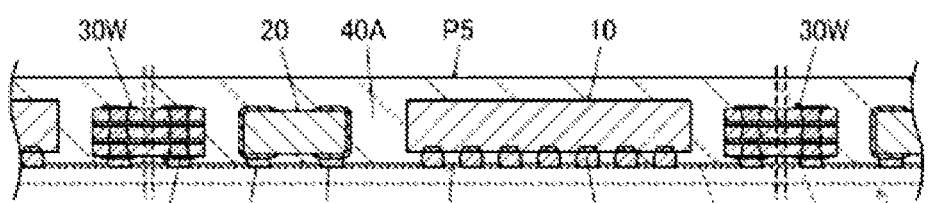
Figure 13B:
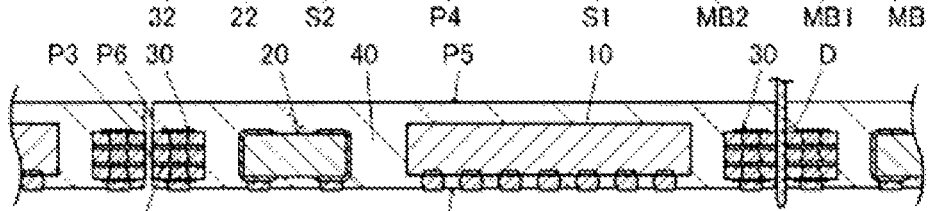
Figure 13C:
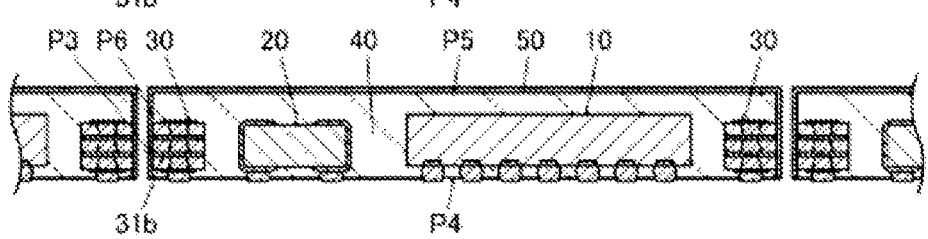

Each of FIGS. 13A, 13B and 13C is a cross-sectional view illustrating an example of a process for manufacturing the electronic component package 100B, specifically, part of the process following the process in FIGS. 12A to 12F.

Figure 14:
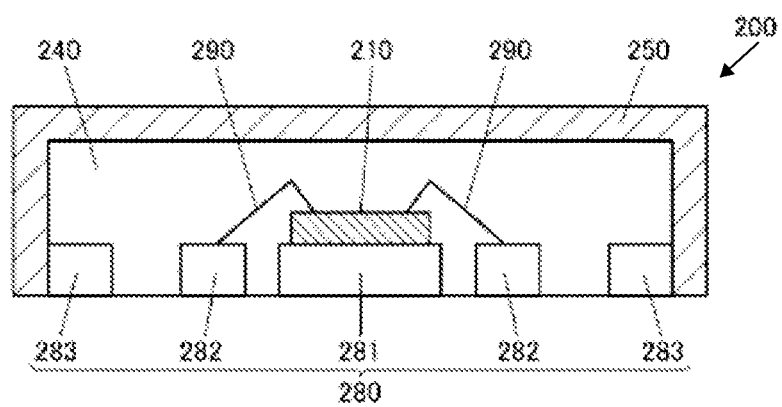

FIG. 14 is a cross-sectional view of an electronic component package 200 described in the background art.

Figure 15A:
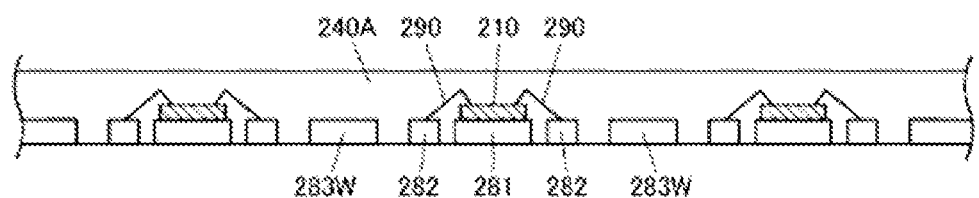
Figure 15B:
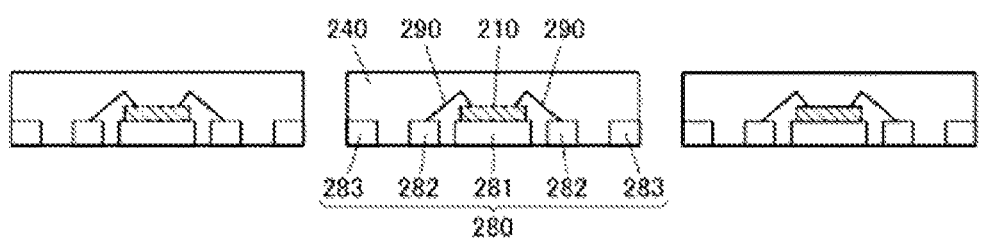
Figure 15C:
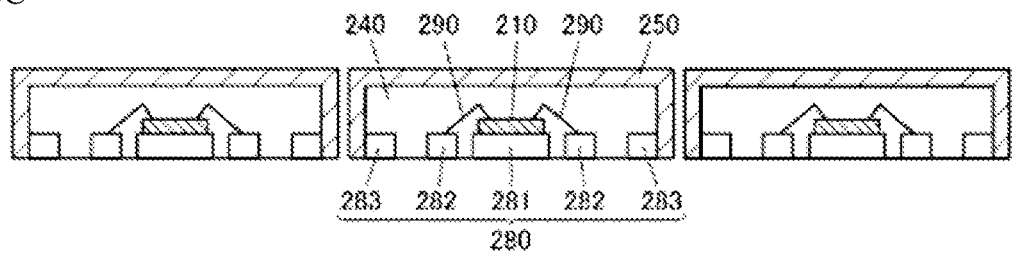

FIGS. 15A, 15B and 15C include cross-sectional views illustrating part of a process for manufacturing an electronic component package 200.

DETAILED DESCRIPTION OF THE DISCLOSURE

Embodiments of the present disclosure will be described below to describe the characteristics of the present disclosure in further detail. The present disclosure is included in, for example, an electronic component package that forms a circuit module required to have a low height, but the application thereof is not limited to this.

Electronic Component Package According to First Embodiment

Structure of Electronic Component Package

A structure and characteristics of an electronic component package 100, which is an electronic component package according to a first embodiment of the present disclosure, will be described with reference to FIG. 1 and FIGS. 2A and 2B.

The drawings are schematic diagrams. Variations in shape between components resulting from the manufacturing process are not necessarily reflected on the drawings. Specifically, the drawings used for illustration in this description are said to essentially represent an actual product although being different from the actual product in some points.

Figure 1:
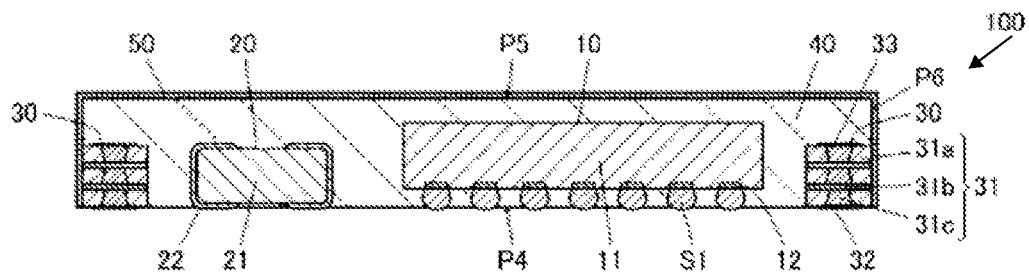
FIG. 1 is a cross-sectional view of an electronic component package 100, which is an electronic component package according to an embodiment of the present disclosure.
Figure 2A:
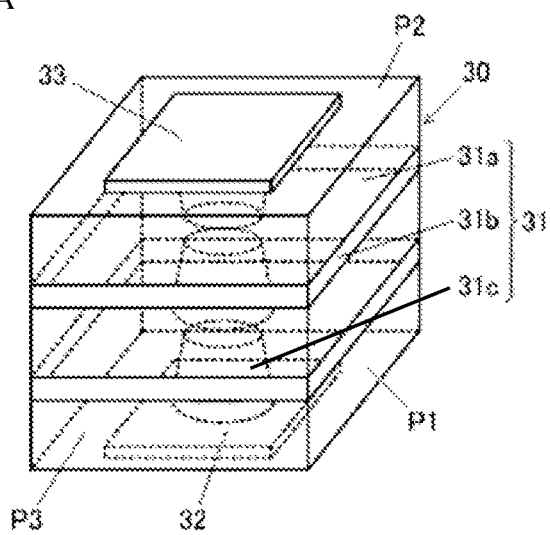
FIGS. 2A and 2B include a perspective view of a grounding member 30 and a perspective partially-cut view of a coupled grounding member 30W used in a process for manufacturing an electronic component package 100.

FIG. 1 is a cross-sectional view of the electronic component package 100. FIG. 2A is a perspective view of a grounding member 30 included in an electronic component package 100. FIG. 2B is a perspective partially-cut view of a coupled grounding member 30W used in a process for manufacturing an electronic component package 100, described below.

As illustrated in FIG. 1, the electronic component package 100 includes an electronic component 10 including an external terminal, grounding members 30, a resin layer 40, and a conductor film 50. The electronic component 10 includes an electronic component element 11, and an external terminal exposed on the surface of the electronic component element 11. The electronic component 10 is an electronic component, such as an integrated circuit (IC) or a circuit module smaller than the electronic component package 100.

In the first embodiment, the external terminal includes an outer electrode 12 and solder bumps S1, which form the first connecting members connected to the outer electrode 12. The solder bumps S1 are formed from a Sn—Ag—Cu-based lead-free solder material. The material for the solder bumps S1 is not limited to this. As will be described below, the external terminal may not include the solder bumps S1.

As illustrated in FIG. 1, the electronic component package 100 may also include an electronic component 20 that includes an electronic component element 21 and an outer electrode 22. Examples of the electronic component 20 include a multilayer capacitor, a multilayer inductor, various types of filters, and various types of ICs.

Each grounding member 30 is connected to the ground electrode of a circuit board (not illustrated) of an electronic device when the electronic component package 100 is connected to the circuit board. As illustrated in FIG. 2A, the grounding member 30 includes a multilayer body 31 and an outer conductor 32 disposed at a first end of the multilayer body 31 in the lamination direction. The grounding member 30 may include an outer conductor 33 disposed at a second end of the multilayer body 31 in the lamination direction.

The multilayer body 31 has a first surface P1, a second surface P2, which is disposed opposite to the first surface P1, and third surfaces P3, which connect the first surface P1 and the second surface P2 to each other. In the first embodiment, the multilayer body 31 is a rectangular parallelepiped. In FIGS. 2A and 2B, the bottom surface corresponds to the first surface P1, the top surface corresponds to the second surface P2, and the four side surfaces correspond to the third surfaces P3. The shape of the multilayer body 31 is not limited to this.

The outer conductor 32 is disposed on the first surface P1. When the grounding member 30 includes the outer conductor 33, the outer conductor 33 is disposed on the second surface P2. When the outer conductor 33 is disposed on the second surface P2, the top and the bottom of the grounding member 30 do not need to be distinguished from each other, so that the electronic component package 100 can be more efficiently manufactured.

In the first embodiment, the multilayer body 31 includes three resin films 31a, two pattern conductors 31b, and three via conductors 31c. The multilayer body 31 is formed by alternately laminating the resin films 31a and the pattern conductors 31b one on another while having the main surface of one of the resin films 31a serving as the first surface P1. The via conductors 31c are disposed inside the multilayer body 31, as will be described below. The structure of the multilayer body 31 is not limited to the above. For example, the multilayer body 31 may be constituted of one resin film 31a, one via conductor 31c disposed in the resin film 31a, and one pattern conductor 31b laminated on the resin film 31a. The multilayer body 31 may also include components other than the resin films 31a, the pattern conductors 31b, and the via conductors 31c.

In the multilayer body 31, each of the pattern conductors 31b has its circumference exposed from the third surfaces P3, which are four side surfaces of the multilayer body 31. The pattern conductors 31b are electrically connected to the via conductor 31c having one end exposed from the first surface P1, directly or indirectly via the other via conductors 31c. The first surface P1 serves as the bottom surface of the multilayer body 31. In addition to the above structure, at least one of the pattern conductors 31b may have at least part of the circumference exposed from the third surfaces P3 of the multilayer body 31 and electrically connected to the via conductor 31c having one end exposed from the first surface P1 of the multilayer body 31 (refer to FIGS. 5A, 5B and 5C, below).

The outer conductor 32 is disposed on the first surface P1 of the multilayer body 31, and electrically connected to a first end of one of the via conductors 31c electrically connected to the pattern conductors 31b having the circumferences exposed from the third surfaces P3 of the multilayer body 31. As described above, at least one via conductor 31c extending in the lamination direction of the multilayer body 31 and connected to the outer conductor 32 is disposed.

The grounding member 30 is formed from, for example, a resin multilayer substrate manufactured by a known manufacturing method. The resin films 31a are formed from an insulating resin material such as epoxy resin. The pattern conductors 31b are formed from copper foil. The via conductors 31c are formed from cured copper paste. The outer conductor 32 is formed from copper foil to which a metal plating film selected from plating films such as Sn, Ni, and Au plating films is applied.

The materials for the components are not limited to the above. For example, the resin films 31a may be made of a composite material containing a woven or nonwoven fabric of, for example, glass, and an insulating resin such as epoxy resin, or a resin material such as a liquid crystal polymer. The via conductors 31c may be made of copper plating.

The resin layer 40 covers part of the electronic component 10 and part of the grounding members 30. Part of the circumferences of the pattern conductors 31b exposed from the third surfaces P3 of the multilayer body 31 is exposed from the resin layer 40. Part of the external terminal of the electronic component 10, that is, part of the solder bumps S1 forming the first connecting member s, and part of the outer conductor 32 of the grounding member 30 are exposed from the resin layer 40. Specifically, part of the solder bumps S1 serving as the external terminal of the electronic component 10 and part of the outer conductor 32 of the grounding member 30 are exposed from the same surface of the resin layer 40.

The resin layer 40 is made of a resin material containing, for example, a glass material or silica dispersed as a filler. Instead of this, the resin layer 40 may be simply made or a resin material.

The conductor film 50 covers the surface of the resin layer 40 to be connected to part of the circumferences of the pattern conductors 31b of the multilayer body 31 exposed from the resin layer 40. The conductor film 50 is made of a copper film formed by adhering metal fine particles to the resin layer 40 by sputtering. Instead of this, the conductor film 50 may be formed by curing a film of a copper paste.

As will be described below, the electronic component package 100 is efficiently manufactured by, firstly, preparing a semifinished product in the form of an aggregate, and then dividing the semifinished product into pieces with a cutting step using a dicing saw or other devices. As illustrated in FIG. 2B, a semifinished product is manufactured from the coupled grounding member 30W including the coupled multilayer body 31W including the via conductors 31c and formed by alternately laminating a coupled resin film 31Wa and a coupled pattern conductor 31Wb.

Figure 2B:
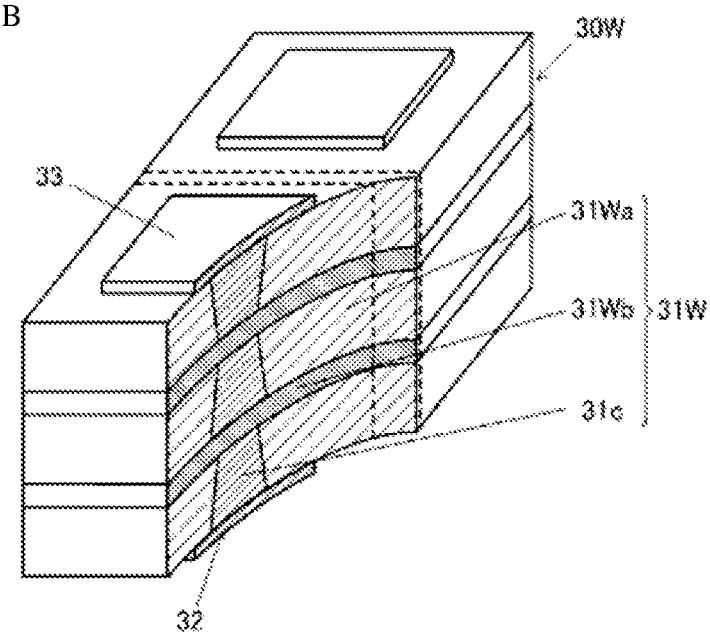

The coupled grounding member 30W illustrated in FIG. 2B includes two grounding members 30. The coupled grounding member 30W includes, for example, a resin multilayer substrate manufactured by a known manufacturing method, as described above. In the above cutting process, the portion drawn with the broken lines is removed by cutting to separate the coupled grounding member 30W into two grounding members 30.

As described above, the coupled grounding member 30W includes the coupled resin films 31Wa. Thus, the coupled grounding member 30W is softer than a coupled unit 283W of a third portion 283 of a lead frame made of a single metal, as described in the background art. Specifically, the difference in hardness between the coupled grounding member 30W and a coupled resin layer 40A (refer to FIG. 3C), described below, is smaller than the difference in hardness between the coupled unit 283W and the coupled resin layer 40A. This structure thus prevents an increase of the resistance of a to-be-cut object against a dicing saw blade that continues cutting into the object after cutting in from the coupled resin layer 40A and reaching the coupled grounding member 30W.

Specifically, the pushing force exerted on the coupled grounding member 30W in the travel direction of the dicing saw blade is small. This small force prevents separation at the interface between the coupled multilayer body and the coupled resin layer. This structure can thus prevent occurrence of structural defects of the finished electronic component package 100.

Method for Manufacturing Electronic Component Package

A method for manufacturing an electronic component package 100 will be described with reference to FIGS. 3A to 3F, and FIGS. 4A and 4B.

Each of FIGS. 3A to 3F illustrates an example of a process for manufacturing the electronic component package 100. FIGS. 3A to 3F are schematic cross-sectional views of successive processes performed in an example of a process for manufacturing the electronic component package 100. FIGS. 3A to 3F correspond to the cross-sectional view of the electronic component package 100 illustrated in FIG. 1.

Figure 3A:
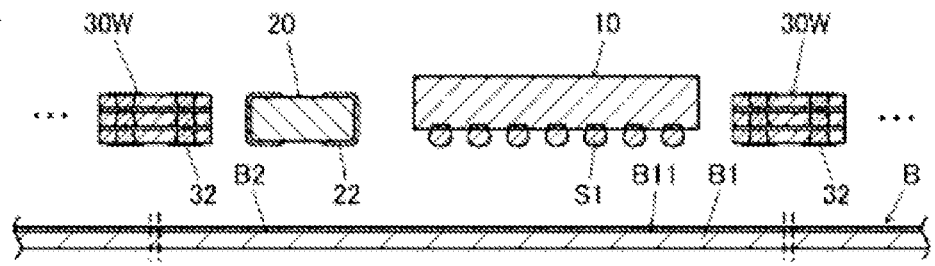
Figure 3B:
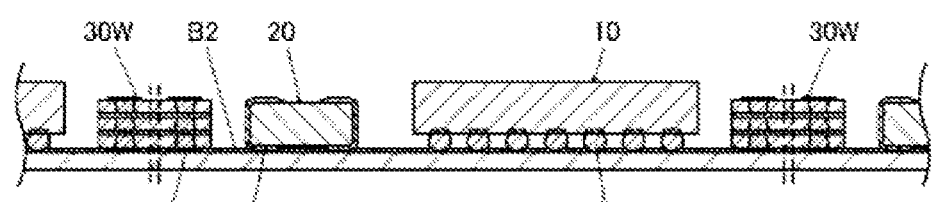

FIG. 3A and FIG. 3B are cross-sectional views of a holding step. In the holding step, as illustrated in FIG. 3A, first, a base B including a base member B1 and an adhesive layer B2 applied to a first main surface B11 of the base member B1, an electronic component 10, an electronic component 20, and coupled grounding members 30W each formed by coupling multiple grounding members 30 together are manufactured or prepared. The electronic component 10, the electronic component 20, and the coupled grounding members 30W have the above-described structures. Thus, they are not described in detail, here. Examples used as the base B include a known sheet to which an adhesive layer is attached.

As illustrated in FIG. 3B, solder bumps S1, which are part of the external terminal of the electronic component 10, the outer electrodes 22 of the electronic component 20, and the outer conductors 32 of the coupled grounding members 30W are arranged on the adhesive layer B2. Thus, the base B holds the electronic component 10, the electronic component 20, and the coupled grounding members 30W. FIG. 4A is a plan view of the electronic component 10, the electronic components 20, and the coupled grounding members 30W arranged on the adhesive layer B2. The outer conductor 33 is not illustrated. The cross-sectional view illustrated in FIG. 3B corresponds to a cross-sectional view of a semifinished product of the electronic component package in an aggregate illustrated in FIG. 4A, taken along the plan including the line X1-X1 and viewed in the arrow direction.

After being cut in a cutting step described below, multiple coupled grounding members 30W are arranged while the third surfaces P3, which are cut surfaces, are exposed on the sixth surfaces P6, which are four side surfaces of the resin layer 40. In this arrangement, part of the circumferences of the cut pattern conductors 31b is exposed from the third surfaces P3 and the sixth surfaces P6. Specifically, the pattern conductors 31b exposed from the four side surfaces of the resin layer 40 and the conductor film 50 can be grounded.

As illustrated in FIG. 4B, the coupled grounding members 30W may be arranged so that the grounding members 30 obtained after cutting are disposed in an area in the electronic component package 100 where few electronic components 10 and few electronic components 20 are disposed. As in the case of FIG. 4A, the outer conductor 33 is not illustrated. Specifically, when each electronic component is disposed at a portion in the electronic component package 100 near the side surfaces, the coupled grounding members 30W can be arranged, while avoiding the above portion, on side surfaces where the electronic components are not disposed nearby. Thus, the electronic component package 100 can achieve size reduction.

Figure 3C:
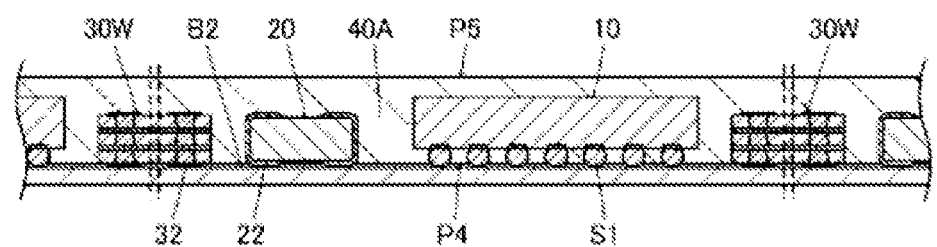

FIG. 3C is a cross-sectional view of a resin-layer application step. In the resin-layer application step, a coupled resin layer 40A is applied onto the adhesive layer B2. The coupled resin layer 40A includes a fourth surface P4, which comes into contact with the adhesive layer B2, and a fifth surface P5, which is disposed opposite to the fourth surface P4. At this time, the coupled resin layer 40A covers the surface of the electronic component 10 excluding the area touching the adhesive layer B2 on the solder bumps S1, the surface of the electronic component 20 excluding the area touching the adhesive layer B2 on the outer electrode 22, and the surfaces of the coupled grounding members 30W excluding the areas touching the adhesive layer B2 on the outer conductors 32.

Figure 3D:
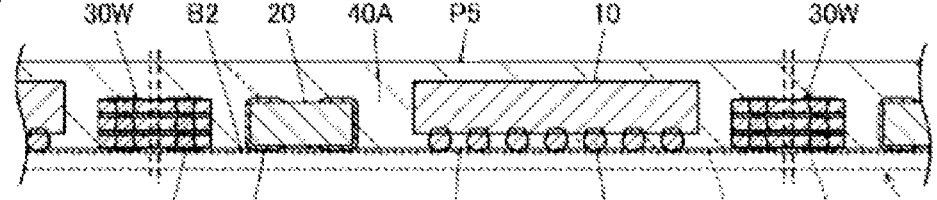

FIG. 3D is a cross-sectional view illustrating a removal step. In the removal step, the base B is removed to expose the fourth surface P4, and expose part of the solder bumps S1 of the electronic component 10, part of the outer electrodes 22 of the electronic component 20, and part of the outer conductors 32 of the coupled grounding members 30W from the fourth surface P4 of the coupled resin layer 40A. This removal step is performed by, for example, separating the base B from the coupled resin layer 40A.

Figure 3E:
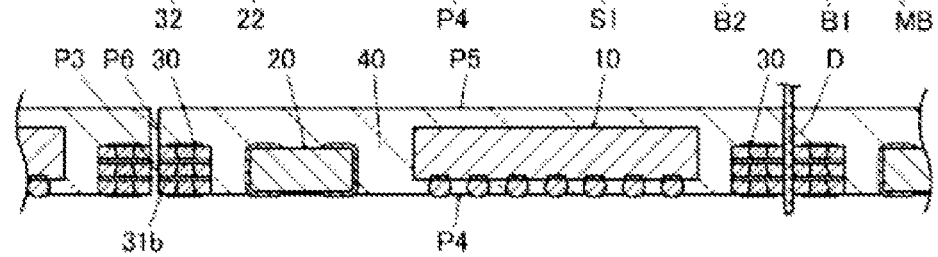

FIG. 3E is a cross-sectional view illustrating the cutting step. In the cutting step, the dicing saw blade D is used to cut the coupled resin layer 40A into resin layers 40 each having the fourth surface P4, the fifth surface P5, and the sixth surfaces P6, which connect the fourth surface P4 and the fifth surface P5 together. In the present embodiment, each resin layer 40 is a rectangular parallelepiped. When the bottom surface of the rectangular parallelepiped serves as the fourth surface P4, and the upper surface of the rectangular parallelepiped serves as the fifth surface P5, the four side surfaces serve as the sixth surfaces P6.

In this step, each of the coupled grounding members 30W is cut together with the coupled resin layer 40A into two grounding members 30, and part of the circumferences of the pattern conductors 31b is exposed from the third surfaces P3 and the sixth surfaces P6.

Figure 3F:
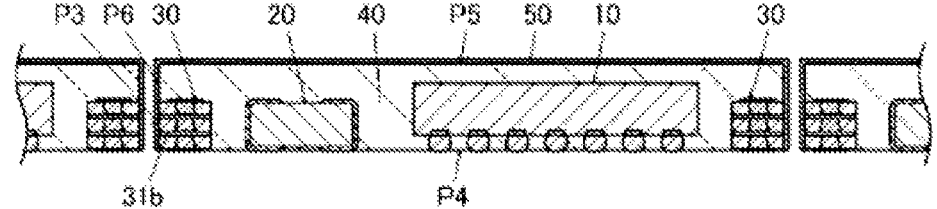

FIG. 3F is a cross-sectional view illustrating a conductor-film application step. In the conductor-film application step, a conductor film is applied to the fifth surface P5 and the sixth surfaces P6, which are surfaces of the resin layer 40, to be connected to part of the circumferences of the pattern conductors 31b exposed from the sixth surfaces P6.

With the above method for manufacturing the electronic component package 100, the dicing saw blade D bears a smaller load when cutting the coupled grounding members 30W, than when cutting coupled grounding members described in the background art, which are all made of metal. In addition, the hardness of a to-be-cut object changes little during cutting. This structure can thus reduce operations of replacing the dicing saw blade D required with a wearing out of the dicing saw blade D that continues cutting the to-be-cut object or required with distortion and breakage. Thus, the electronic component package 100 can be smoothly manufactured.

Coupled Multilayer Body Modification Example

The structures and characteristics of coupled grounding members 30W according to first to seventh modification examples used for manufacturing the electronic component package 100 according to the first embodiment will be described with reference to FIG. 5A to FIG. 9.

FIGS. 5A, 5B and 5C include bottom views of coupled grounding members 30W according to the first to third modification examples. The coupled grounding members 30W according to the first to third modification examples basically have the same structure as the coupled grounding members 30W according to the first embodiment.

FIG. 5A is a plan view of one coupled grounding member 30W according to the first modification example. In the first modification example illustrated in FIG. 5A, the coupled multilayer body 31W includes a rectangular coupled pattern conductor 31Wb, as in the case of the coupled grounding member 30W according to the first embodiment. However, the coupled pattern conductor 31Wb is not exposed from the side surfaces of the coupled multilayer body 31W. Specifically, the pattern conductors 31b of the multilayer body 31 obtained by cutting the coupled multilayer body 31W according to the first modification example are exposed only from the cut surfaces among the third surfaces P3, without touching the side surfaces adjacent to the cut surfaces.

In the first modification example, the side surfaces of the coupled multilayer body 31W are formed from coupled resin films 31Wa. Thus, the side surfaces are more tightly in contact with the coupled resin layer 40A, which are both made of resin materials. Thus, separation at the interface between the coupled grounding member 30W and the coupled resin layer 40A is more effectively prevented. Thus, structural defects of the finished electronic component package 100 are more effectively prevented.

FIG. 5B is a plan view of one coupled grounding member 30W according to a second modification example. In the second modification example illustrated in FIG. 5B, the coupled multilayer body 31W includes a coupled pattern conductor 31Wb having a shape of dumbbells in a plan view. As in the case of the first modification example, the coupled pattern conductor 31Wb is not exposed from the side surfaces of the coupled multilayer body 31W.

This structure can also obtain the same effects as those of the first modification example. In the second modification example, the interface between the resin film 31a and the exposed pattern conductor 31b is reduced in the cross section of the multilayer body 31, compared to that in the first modification example. This structure can thus effectively prevent defects, such as separation at the interface between the resin film 31a and the exposed pattern conductor 31b during the cutting step, or intrusion of moisture at the interface.

FIG. 5C is a plan view of one coupled grounding member 30W according to the third modification example. In the third modification example illustrated in FIG. 5C, the coupled multilayer body 31W includes a coupled pattern conductor 31Wb that is exposed after cutting, continuous between the cut surface and part of the side surfaces adjacent to the cut surface without being exposed from other side surface.

This structure also has the same effects as those of the first modification example. In the third modification example, the exposed pattern conductors 31b have an area the same as that in the first embodiment in the cut surface of the multilayer body 31. Specifically, the area over which the pattern conductors 31b are coupled to the conductor film 50 is not reduced from the area over which they are coupled in the first embodiment. Thus, the conductor film 50 can be effectively grounded.

Each of FIGS. 6A, 6B and 6C illustrates a coupled grounding member 30W according to a fourth modification example. FIG. 6A is a bottom view of the coupled grounding member 30W. FIG. 6B is a cross-sectional view of the coupled grounding member 30W illustrated in FIG. 6A, taken along the plane including the line X2-X2 and viewed in the arrow direction. FIG. 6C is a front view of a grounding member 30 according to a modification example obtained by cutting the coupled grounding member 30W according to the fourth modification example.

In the fourth modification example illustrated in FIGS. 6A, 6B and 6C, the coupled multilayer body 31W includes, as multiple via conductors 31c, two via conductors 31c1 and one via conductor 31c2. The via conductors 31c1 are arranged at the same positions as those in the coupled multilayer body 31W according to the first embodiment. On the other hand, as illustrated in FIGS. 2A and 2B, the via conductor 31c2 is arranged to overlap a portion that is to be cut off in the cutting step. The number of the via conductor 31c2 is not limited to one.

Specifically, as illustrated in FIG. 6C, the multilayer body 31 obtained by cutting the coupled multilayer body 31W according to the fourth modification example has a third surface P3, which is a cut surface, from which the cut via conductor 31c2 is exposed in addition to the pattern conductors 31b. Thus, the electrically contact area between the grounding member 30 and the conductor film 50 increases. Thus, the conductor film 50 can be further effectively grounded.

Each of FIGS. 7A, 7B and 7C illustrates a coupled grounding member 30W according to the fifth modification example. FIG. 7A is a bottom view of the coupled grounding member 30W. FIG. 7B is a cross-sectional view of the coupled grounding member 30W illustrated in FIG. 7A, taken along the plane including the line X3-X3 and viewed in the arrow direction. FIG. 7C is a front view of the grounding member 30 according to a modification example obtained by cutting the coupled grounding member 30W according to the fifth modification example.

The coupled grounding member 30W according to the fifth modification example illustrated in FIGS. 7A, 7B and 7C basically has a structure the same as that of the coupled grounding member 30W according to the first embodiment. The fifth modification example is square in a plan view. The outer conductors 32 are arranged to be symmetric on a diagonal of the first surface P1. Specifically, the portion that is cut off in the cutting step is an area indicated with the broken lines in FIG. 7A, including a diagonal orthogonal to the diagonal on which the outer conductors 32 are arranged in the plan view. Thus, the grounding members 30 obtained after cutting have a shape of right-angled isosceles triangles in a plan view.

In this case, the area over which the pattern conductors 31b are exposed in the cut surface of the multilayer body 31 can be increased. Thus, the electrically contact area between the grounding member 30 and the conductor film 50 increases. The conductor film 50 can thus be further effectively grounded.

FIG. 8 is a plan view of another example of a process for manufacturing an electronic component package 100, where the solder bumps S1 of the electronic component 10, the outer electrodes 22 of the electronic components 20, the outer conductors 32 of coupled grounding members 30W according to a sixth modification example are arranged on an adhesive layer B2. Each of the coupled grounding members 30W according to the sixth modification example corresponds to the multiple coupled grounding members 30W according to the first embodiment connected together while having the portions cut into the grounding members 30 arranged on the same plane. The outer conductor 33 is not illustrated.

Here, the pattern conductors 31b are exposed at separate areas from each of the third surfaces P3, which are cut surfaces of each coupled grounding member 30W. The number of the coupled grounding members 30W connected together is not limited to a particular number.

FIG. 9 is a plan view of another example of a process for manufacturing an electronic component package 100, where solder bumps S1 of the electronic component 10, the outer electrodes 22 of the electronic components 20, and the outer conductors 32 of coupled grounding members 30W according to a seventh modification example are arranged on an adhesive layer B2. Each of the coupled grounding member 30W according to the seventh modification example includes the coupled grounding members 30W according to the sixth modification example connected together in a mesh form. As in FIG. 8, the outer conductor 33 is not illustrated in FIG. 9.

Here, the pattern conductors 31b after cutting has a shape of a single window frame, with sides from each of which the grounding members 30 are exposed at separate areas. As in the case of the sixth modification example, the number of coupled grounding members 30W connected together is not limited to a particular number.

In the process for manufacturing the electronic component package 100, the coupled grounding members 30W according to sixth and seventh modification examples are used to reduce time taken to arrange the coupled grounding members 30W on the adhesive layer B2.

Modification Example of Electronic Component Package According to First Embodiment The structure and characteristics of an electronic component package 100A, which is a modification example of the electronic component package 100 according to the first embodiment, will be described with reference to FIG. 10.

FIG. 10 is a cross-sectional view of the electronic component package 100A. The electronic component package 100A basically has the same structure as that of the electronic component package 100, and includes an electronic component 10A including an external terminal, grounding members 30, a resin layer 40, and a conductor film 50.

However, the external terminal of the electronic component 10A does not include the solder bumps S1.

The electronic component package 100A also obtains the same effects as those of the electronic component package 100. Compared to the electronic component package 100, the electronic component package 100A can reduce its height by the absence of the solder bumps S1. Thus, an electronic device on which the electronic component package 100A is mounted can reduce its size.

Electronic Component Package According to Second Embodiment

Structure of Electronic Component Package

The structure and characteristics of an electronic component package 100B, which is an electronic component package according to a second embodiment of the present disclosure, will be described with reference to FIG. 11.

FIG. 11 is a cross-sectional view of the electronic component package 100B. The electronic component package 100B includes an electronic component 10 including an external terminal, grounding members 30, a solder member S2 forming a second connecting member, a resin layer 40, and a conductor film 50. The electronic component 10, the grounding members 30, the resin layer 40, and the conductor film 50 are similar to those of the first embodiment, and thus are not described here. When the electronic component package 100B includes an electronic component 20 as illustrated in FIG. 11, the same as in the first embodiment holds true for the electronic component 20.

In the electronic component package 100B, the external terminal of the electronic component 10 includes an outer electrode 12 and solder bumps S1 forming the first connecting members. The solder members S2 are connected to the outer conductor 32 of the grounding member 30. When the electronic component package 100B includes the electronic component 20, as illustrated in FIG. 11, the solder members S2 are also connected to the outer electrodes 22 of the electronic component 20.

The resin layer 40 covers the electronic component 10, the grounding members 30, and the solder members S2. Here, part of the circumferences of the pattern conductors 31b exposed from the third surfaces P3 of the multilayer body 31 is exposed from the resin layer 40. In addition, part of the solder bumps S1 and part of the solder members S2 are exposed from the resin layer 40.

The electronic component package 100B can also obtain the same effects as those of the electronic component package 100. In addition, the electronic component package 100B also has the following effects.

When the conductor film 50 is formed on the resin layer 40 by sputtering, metal fine particles may fail to fully adhere to the mount surface near the side surface. Also, when the conductor film 50 is formed with a copper paste and a device such as a spin coat, the copper paste may fail to fully cover the surface. Specifically, when arranged on the mount surface near the side surfaces, the pattern conductors 31b in the multilayer body 31 may fail to be fully connected to the conductor film 50.

On the other hand, in the electronic component package 100B, the multilayer bodies 31 of the grounding members 30 are spaced apart from the bottom surface of the resin layer 40 with the solder members S2 that is connected to the outer conductors 32. Specifically, the pattern conductors 31b in each multilayer body 31 are spaced apart from the bottom surface by the distance of the solder member S2. This structure can thus prevent the above problem, and allows the pattern conductors 31b in the multilayer body 31 and the conductor film 50 to be fully connected together.

Method for Manufacturing Electronic Component Package

A method for manufacturing the electronic component package 100B will be described with reference to FIGS. 12A to 12F and FIGS. 13A, 13B and 13C.

Each of FIGS. 12A to 12F and FIGS. 13A, 13B and 13C illustrates an example of a process for manufacturing the electronic component package 100B. FIGS. 12A to 12F are schematic cross-sectional views illustrating sequential steps performed in an example of the process for manufacturing the electronic component package 100B. FIGS. 13A to 13C are schematic cross-sectional views of the steps following the steps in FIGS. 12A to 12F. Each of the cross-sectional views in FIGS. 12A to 12F and FIGS. 13A, 13B and 13C corresponds to the cross-sectional view of the electronic component package 100B illustrated in FIG. 11.

FIGS. 12A to 12E are cross-sectional views illustrating a holding step. In the holding step, first, as illustrated in FIG. 12A, a metal base MB, which includes a metal base member MB1 and a photoresist layer MB2 applied to a first main surface MB11 of the metal base member MB1, an electronic component 10, an electronic component 20, coupled grounding members 30W each including multiple grounding members 30 coupled together, and solder paste (not illustrated) serving as the solder members S2 are manufactured or prepared. The electronic component 10, the electronic component 20, and the coupled grounding members 30W have the above-described structures. Thus, the detailed description thereof will not be described.

Examples used as the metal base member MB1 include metal foil on which the lead-free solder containing Sn has high wettability and that contains a material having a contact angle of smaller than or equal to 10°, such as copper foil having a thickness of, for example, greater than or equal to 40 μm and smaller than or equal to 100 μm. Examples used as the photoresist layer MB2 include a film that easily repels the above solder material and contains a material having a contact angle of higher than or equal to 90°, such as an aluminum film with a thickness of, for example, greater than or equal to 0.1 μm and smaller than or equal to 10 μm. The above photoresist layer MB2 is applied to the first main surface of the metal base member MB1 by, for example, sputtering. However, the metal base member MB1 and the photoresist layer MB2 are not limited to the above.

Subsequently, as illustrated in FIG. 12B, multiple through-holes H are formed in the photoresist layer MB2. The multiple through-holes H are formed by irradiating the photoresist layer MB2 with a laser beam LB to remove areas of the photoresist layer MB2 on which the laser beam LB is irradiated. Examples used as the laser beam LB include a YAG laser beam and a $CO_2$ laser beam. The laser beam LB has its properties, such as the irradiation spot diameter and the laser beam output, adjusted so that the areas of the first main surface MB11 of the metal base member MB1 in which the through-holes H are formed retain their flatness.

Subsequently, as illustrated in FIG. 12C, some of the through-holes H relating to the connection between the electronic component 20 or the coupled grounding members 30W and the metal base member MB1 are filled with solder paste SP2, serving as the solder members S2 forming second connecting members. The through-holes H are filled with the solder paste SP2 by, for example, screen printing. In the example illustrated in FIG. 12C, the through-holes H for the connection between the electronic component 10 and the metal base member MB1 are left without being filled with the solder paste SP2.

As illustrated in FIG. 12D, the solder bumps S1 that form the first connecting members in the external terminal of the electronic component 10 are connected, by ultrasonic bonding or another method, to the portions of the metal base member MB1 exposed through the through-holes H.

The electronic component 20 and the coupled grounding members 30W are mounted on the solder paste SP2, and subjected to reflow in this state. Thus, as illustrated in FIG. 12E, the outer electrodes 22 of the electronic component 20 and the outer conductors 32 of the coupled grounding members 30W are connected to the portions of the metal base member MB1 exposed through the through-holes H via the solder members S2. Thus, the electronic component 10, the electronic component 20, and the coupled grounding members 30W are held on the metal base MB.

The solder bumps S1 are made of the same solder material as that in the first embodiment. The solder members S2 are made of the same solder material as that for the solder bumps S1. However, the solder bumps S1 and the solder members S2 may be made of different solder materials.

Connection of the electronic component 10 to the metal base member MB1 and connection of the electronic component 20 and the coupled grounding members 30W to the metal base member MB1 may be performed in the reverse order. Alternatively, all the through-holes H may be filled with the solder paste SP2 to connect the electronic component 10 to the metal base member MB1 via the solder bumps S1 and the solder members S2. In this case, the first connecting members include the solder bumps S1 and the solder members S2.

FIG. 12F is a cross-sectional view illustrating a resin-layer application step. In the resin-layer application step, a coupled resin layer 40A is applied to the photoresist layer MB2. The coupled resin layer 40A has a fourth surface P4, which is in contact with the photoresist layer MB2, and a fifth surface P5, which is disposed opposite to the fourth surface P4. Here, the coupled resin layer 40A covers the surface of the electronic component 10 excluding an area over which the solder bumps S1 are connected to the metal base member MB1 and the area over which they are in contact with the photoresist layer MB2, the surface of the electronic component 20 excluding an area over which the outer electrodes 22 are connected to the solder members S2, the surface of the coupled grounding members 30W excluding an area over which the outer conductors 32 are connected to the solder members S2, and the exposed surfaces of the solder members S2.

FIG. 13A is a cross-sectional view illustrating a removal step. In the removal step, the metal base MB is removed to expose the fourth surface P4, and to expose, from the fourth surface P4, part of the solder bumps S1 on the electronic component 10, part of the solder members S2 connected to the outer electrodes 22 of the electronic component 20, and part of the solder members S2 connected to the outer conductors 32 of the coupled grounding members 30W. This removal step is performed by dissolving the metal base MB by etching.

Examples of an etchant used to dissolve copper foil serving as the metal base member MB1 for removal include a $CuCl_2$ solution. Examples of an etchant used to dissolve an Al film serving as the photoresist layer MB2 for removal include a $FeCl_3$ solution. In either case, an etchant that does not dissolve the coupled resin layer 40A is used.

FIG. 13B is a cross-sectional view illustrating a cutting step. In the cutting step, the coupled resin layer 40A is cut with the dicing saw blade D into resin layers 40, each having a fourth surface P4, a fifth surface P5, and sixth surfaces P6, which connect the fourth surface P4 and the fifth surface P5. Specifically, each resin layer 40 is a rectangular parallelepiped. When the bottom surface of the rectangular parallelepiped is defined as the fourth surface P4, and the upper surface of the rectangular parallelepiped is defined as the fifth surface P5, the four side surfaces serve as the sixth surfaces P6.

In this step, each coupled grounding member 30W is divided into two grounding members 30, and part of the circumferences of the pattern conductors 31b is exposed from the third surfaces P3 and the sixth surfaces P6.

FIG. 13C is a cross-sectional view illustrating a conductor-film application step. In the conductor-film application step, the conductor film is applied to the fifth surface P5 and the sixth surfaces P6 of the resin layer 40 to be connected to part of the circumferences of the pattern conductors 31b exposed from the sixth surfaces P6.

The above method for manufacturing the electronic component package 100B can achieve the same effects as those of the above method for manufacturing the electronic component package 100.

Embodiments described herein are mere examples. The present disclosure is not limited to the above embodiments or modification examples, and may be changed or modified in various manners within the scope of the present disclosure.

100 electronic component package
10 electronic component
11 electronic component element
12 outer electrode
30 grounding member
31 multilayer body
31a resin film
31b pattern conductor
31c via conductor
32, 33 outer conductor
40 resin layer
50 conductor film
S1 solder bump (first connecting member)

The invention claimed is:

1. An electronic component package, comprising:
a resin layer;
an electronic component, a part of the electronic component being covered with the resin layer, and the electronic component including an external terminal;
a grounding member, a part of the grounding member being covered with the resin layer; and
a conductor film disposed on a surface of the resin layer,
wherein the grounding member includes a multilayer body and an outer conductor disposed at an end portion of the multilayer body,
wherein the multilayer body has a first surface, a second surface disposed opposite to the first surface, and a third surface connecting the first surface and the second surface together,
wherein, in the multilayer body includes at least one resin film and at least one pattern conductor laminated one on another, and at least one via conductor extending in a direction from the first surface to the second surface and connected to the outer conductor,
wherein, in the multilayer body, at least a part of an outer edge of at least one of the pattern conductors is connected to the conductor film at the third surface and electrically connected to the via conductor, and
wherein a part of the external terminal and a part of the outer conductor are exposed from a same side of the resin layer.

2. The electronic component package according to claim 1, wherein the external terminal includes an outer electrode and a first connecting member connected to the outer electrode.

3. A method for manufacturing an electronic component package, the electronic component package including
a resin layer,
an electronic component, a part of the electronic component being covered with the resin layer, and the electronic component including an external terminal,
a grounding member, a part of the grounding member being covered with the resin layer, the grounding member including a multilayer body and an outer conductor disposed at an end portion of the multilayer body, and the multilayer body including at least one resin film and at least one pattern conductor laminated one on another, and
a conductor film disposed on a surface of the resin layer,
the method comprising:
a holding step of manufacturing or preparing a base including a base member and an adhesive layer applied to a first main surface of the base member, the electronic component, and a coupled grounding member including a coupled multilayer body obtained by coupling a plurality of the multilayer bodies, and arranging the external terminal of the electronic component and the outer conductor of the coupled grounding member on the adhesive layer to allow the electronic component and the coupled grounding member to be held on the base;
a resin-layer application step of applying the resin layer to the adhesive layer to cover a surface of the electronic component excluding an area over which the external terminal is in contact with the adhesive layer and a surface of the coupled grounding member excluding an area over which the outer conductor is in contact with the adhesive layer;
a removal step of removing the base to expose, from a same side of the resin layer, at least a part of the external terminal of the electronic component and at least a part of the outer conductor of the coupled grounding member;
a cutting step of cutting, together with the resin layer, the coupled grounding member into a plurality of the grounding members and exposing a part of an outer edge of the pattern conductor; and
a conductor-film application step of applying the conductor film to a surface of the resin layer to connect the conductor film with the exposed part of the outer edge of the pattern conductor.

4. The method according to claim 3, wherein the external terminal includes an outer electrode and a first connecting member connected to the outer electrode.

* * * * *